US012812783B2

(12) United States Patent
Miyabara et al.

(10) Patent No.: US 12,812,783 B2
(45) Date of Patent: Nov. 24, 2026

(54) PRINTED WIRING BOARD AND COIL DEVICE

(71) Applicant: SUMITOMO ELECTRIC PRINTED CIRCUITS, INC., Shiga (JP)

(72) Inventors: Masaki Miyabara, Shiga (JP); Kou Noguchi, Shiga (JP)

(73) Assignee: SUMITOMO ELECTRIC PRINTED CIRCUITS, INC., Shiga (JP)

( * ) Notice: Subject to any disclaimer, the term of this patent is extended or adjusted under 35 U.S.C. 154(b) by 207 days.

(21) Appl. No.: 18/720,856

(22) PCT Filed: Dec. 5, 2022

(86) PCT No.: PCT/JP2022/044755
§ 371 (c)(1),
(2) Date: Jun. 17, 2024

(87) PCT Pub. No.: WO2023/127414
PCT Pub. Date: Jul. 6, 2023

(65) Prior Publication Data

US 2025/0071899 A1 Feb. 27, 2025

(30) Foreign Application Priority Data

Dec. 27, 2021 (JP) ................................ 2021-212226

(51) Int. Cl.
*H05K 1/11* (2006.01)
*H05K 1/181* (2026.01)
*H05K 1/189* (2026.01)

(52) U.S. Cl.
CPC ............ *H05K 1/118* (2013.01); *H05K 1/116* (2013.01); *H05K 1/181* (2013.01); *H05K 1/189* (2013.01);

(Continued)

(58) Field of Classification Search
CPC ... H01F 2017/006; H05K 1/165; H05K 1/118
See application file for complete search history.

(56) References Cited

U.S. PATENT DOCUMENTS

2011/0050381 A1* 3/2011 Olson ................ H01F 17/0006 336/200
2018/0374630 A1* 12/2018 Morita ................ H01F 17/0013

FOREIGN PATENT DOCUMENTS

JP 58-124918 U1 8/1983
JP 2011-192710 A 9/2011

(Continued)

*Primary Examiner* — Timothy J Thompson
*Assistant Examiner* — John B Freal
(74) *Attorney, Agent, or Firm* — Renner, Otto, Boisselle & Sklar, LLP

(57) ABSTRACT

A printed wiring board includes: a base film having a first main surface and a second main surface; a first wire disposed on the first main surface; and a second wire disposed on the second main surface. The base film has a first portion and a second portion. The first portion and the second portion are arranged along a first direction, the first direction being a longitudinal direction of the base film in a plan view. A first boundary is along a second direction orthogonal to the first direction in a plan view, the first boundary being a boundary between the first portion and the second portion. The first wire has a first coil portion located in the first portion and wound spirally in a plan view, and a second coil portion located in the second portion and wound spirally in a plan view.

10 Claims, 6 Drawing Sheets

(52) U.S. Cl.
CPC .............. *H05K 2201/09263* (2013.01); *H05K 2201/09272* (2013.01); *H05K 2201/09536* (2013.01)

(56) References Cited

FOREIGN PATENT DOCUMENTS

| | | | |
|---|---|---|---|
| JP | 2020-181852 | A | 11/2020 |
| JP | 2021-19014 | A | 2/2021 |

* cited by examiner

PRINTED WIRING BOARD AND COIL DEVICE

TECHNICAL FIELD

The present disclosure relates to a printed wiring board and a coil device. The present application claims the priority based on Japanese Patent Application No. 2021-212226 filed on Dec. 27, 2021. The entire contents of the description in this Japanese patent application are incorporated herein by reference.

BACKGROUND ART

For example, Japanese Patent Laying-Open No. 2020-181852 (PTL 1) describes a printed wiring board. The printed wiring board described in PTL 1 has a flexible substrate, a first coil wire and a second coil wire. The flexible substrate has a first surface and a second surface. The second surface is a surface opposite to the first surface. The flexible substrate has a plurality of portions in a plan view. The plurality of portions of the flexible substrate are arranged along a first direction. The first direction is a longitudinal direction of the flexible substrate in a plan view. A boundary between adjacent two of the plurality of portions of the flexible substrate is along a second direction. The second direction is a direction orthogonal to the first direction.

The first wire is disposed on the first surface and has a plurality of first coils. Each of the plurality of first coils is a portion of the first wire wound spirally in a plan view. The plurality of first coils are disposed in the plurality of portions of the flexible substrate, respectively.

The second wire is disposed on the second surface and has a plurality of second coils. Each of the plurality of second coils is a portion of the second wire wound spirally in a plan view. The plurality of second coils are disposed in the plurality of portions of the flexible substrate, respectively.

The flexible substrate is folded in a zigzag manner along a boundary between adjacent two of the plurality of portions. As a result, there is obtained a coil device in which the plurality of first coils and the plurality of second coils are alternately stacked with one of the plurality of portions of the flexible substrate being interposed.

CITATION LIST

Patent Literature

PTL 1: Japanese Patent Laying-Open No. 2020-181852

SUMMARY OF INVENTION

A printed wiring board according to the present disclosure includes: a base film having a first main surface and a second main surface; a first wire disposed on the first main surface; and a second wire disposed on the second main surface. The base film has a first portion and a second portion. The first portion and the second portion are arranged along a first direction, the first direction being a longitudinal direction of the base film in a plan view. A first boundary is along a second direction orthogonal to the first direction in a plan view, the first boundary being a boundary between the first portion and the second portion. The first wire has a first coil portion located in the first portion and wound spirally in a plan view, and a second coil portion located in the second portion and wound spirally in a plan view. The first portion is disposed to partially overlap with the second portion in a plan view when the base film is folded along the first boundary such that the first coil portion overlaps with the second coil portion in a plan view.

DETAILED DESCRIPTION

Figure 1:
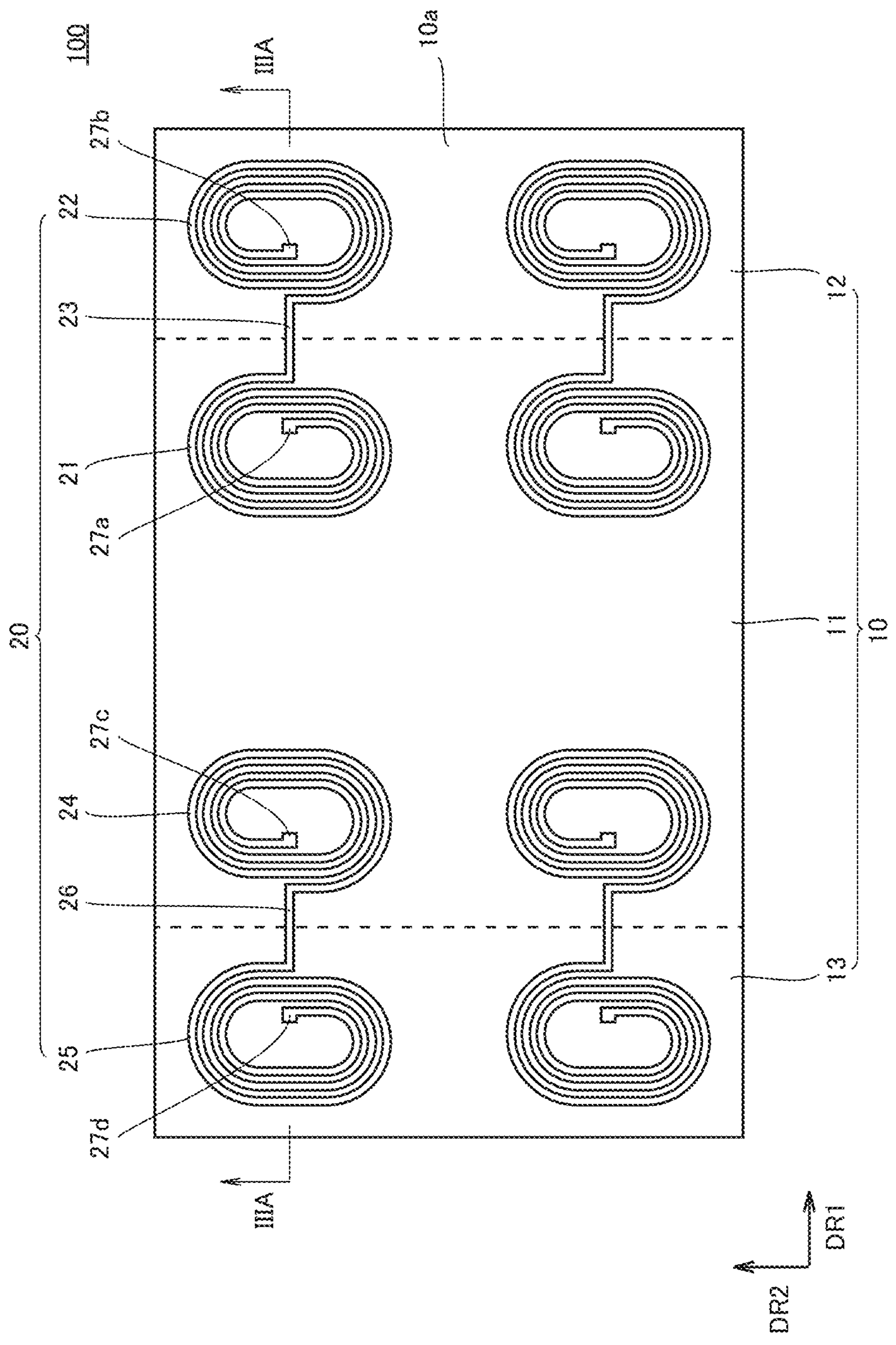
FIG. 1 is a plan view of a printed wiring board 100.

Problem to be Solved by the Present Disclosure

In the printed wiring board described in PTL 1, each of the plurality of portions of the flexible substrate has the same shape in a plan view. Therefore, a thickness of the coil device obtained from the printed wiring board described in PTL 1 is large in any part. As a result, this coil device has room for improvement in incorporability.

The present invention has been made in view of the problem of the conventional technique as described above. More specifically, the present disclosure provides a printed wiring board from which a coil device partially having a small thickness when assembled is obtained.

Advantageous Effect of the Present Disclosure

According to the printed wiring board of the present disclosure, a coil device partially having a small thickness when assembled is obtained.

Description of Embodiments of the Present Disclosure

First, embodiments of the present disclosure will be listed and described.

(1) A printed wiring board according to an embodiment includes: a base film having a first main surface and a second main surface; a first wire disposed on the first main surface; and a second wire disposed on the second main surface. The base film has a first portion and a second portion. The first portion and the second portion are arranged along a first direction, the first direction being a longitudinal direction of the base film in a plan view. A first boundary is along a second direction orthogonal to the first direction in a plan view, the first boundary being a boundary between the first portion and the second portion. The first wire has a first coil portion located in the first portion and wound spirally in a plan view, and a second coil portion located in the second portion and wound spirally in a plan view. The first portion is disposed to partially overlap with the second portion in a plan view when the base film is folded along the first boundary such that the first coil portion overlaps with the second coil portion in a plan view.

According to the printed wiring board of (1) above, a coil device partially having a small thickness when assembled is obtained.

(2) In the printed wiring board of (1) above, the second wire may have a third coil portion located in the first portion and wound spirally in a plan view, and a fourth coil portion located in the second portion and wound spirally in a plan view. The third coil portion and the fourth coil portion may overlap with the first coil portion and the second coil portion in a plan view, respectively.

(3) In the printed wiring board of (2) above, the base film may further have a third portion. The first portion may be sandwiched between the second portion and the third portion in the first direction. A second boundary may be along the second direction, the second boundary being a boundary between the first portion and the third portion. The first wire may have a fifth coil portion located in the first portion and wound spirally in a plan view, and a sixth coil portion located in the third portion and wound spirally in a plan view. The second wire may have a seventh coil portion located in the first portion and wound spirally in a plan view, and an eighth coil portion located in the third portion and wound spirally in a plan view. The seventh coil portion and the eighth coil portion may overlap with the fifth coil portion and the sixth coil portion in a plan view, respectively. The second portion may be disposed to be spaced apart from the third portion when the base film is folded along the first boundary such that the first coil portion overlaps with the second coil portion in a plan view and the base film is folded along the second boundary such that the fifth coil portion overlaps with the sixth coil portion in a plan view.

(4) A coil device according to an embodiment includes: a base film having a first main surface and a second main surface; a first wire disposed on the first main surface; and a second wire disposed on the second main surface. The base film has a first portion and a second portion. The first portion and the second portion are arranged along a first direction before the base film is folded, the first direction being a longitudinal direction of the base film in a plan view. A first boundary is along a second direction orthogonal to the first direction in a plan view, the first boundary being a boundary between the first portion and the second portion. The first wire has a first coil portion located in the first portion and wound spirally in a plan view, and a second coil portion located in the second portion and wound spirally in a plan view. The base film is folded along the first boundary such that the first coil portion overlaps with the second coil portion in a plan view. The first portion partially overlaps with the second portion in a plan view in a state where the base film is folded.

According to the coil device of (4) above, a portion where the first portion and the second portion do not overlap with each other is smaller in thickness than a portion where the first portion and the second portion overlap with each other, and thus, incorporability is improved.

(5) In the coil device of (4) above, the second wire may have a third coil portion located in the first portion and wound spirally in a plan view, and a fourth coil portion located in the second portion and wound spirally in a plan view. The third coil portion and the fourth coil portion may overlap with the first coil portion and the second coil portion in a plan view, respectively.

(6) In the coil device of (5) above, the first main surface located in the first portion may partially face the first main surface located in the second portion, in the state where the base film is folded. The first wire may further have a first connection portion that connects the first coil portion and the second coil portion. The first connection portion may extend to intersect with the first boundary.

According to the coil device of (6) above, the first connection portion is located inside the folded base film, and thus, breakage is less likely to occur in the first connection portion.

(7) The coil device of (4) above may further include an electronic component. The second main surface located in the first portion may partially face the second main surface located in the second portion, in the state where the base film is folded. The second portion may be spaced apart from the first portion in the state where the base film is folded. The electronic component may be disposed between the first portion and the second portion in the state where the base film is folded, and connected to the second wire.

According to the coil device of (7) above, a space for disposing the electronic component between the first portion and the second portion in the state where the base film is folded can be secured.

(8) In the coil device of (5) above, the base film may further have a third portion. The first portion may be sandwiched between the second portion and the third portion in the first direction before the base film is folded. A second boundary may be along the second direction, the second boundary being a boundary between the first portion and the third portion. The first wire may have a fifth coil portion located in the first portion and wound spirally in a plan view, and a sixth coil portion located in the third portion and wound spirally in a plan view. The second wire may have a seventh coil portion located in the first portion and wound spirally in a plan view, and an eighth coil portion located in the third portion and wound spirally in a plan view. The seventh coil portion and the eighth coil portion may overlap with the fifth coil portion and the sixth coil portion in a plan view, respectively. The base film may be folded along the first boundary such that the first coil portion overlaps with the second coil portion in a plan view, and may be folded along the second boundary such that the fifth coil portion overlaps with the sixth coil portion in a plan view. The second portion may be spaced apart from the third portion in the state where the base film is folded.

(9) In the coil device of (8) above, the first main surface located in the first portion may partially face the first main surface located in the third portion, in the state where the base film is folded. The first wire may further have a second connection portion that connects the fifth coil portion and the sixth coil portion. The second connection portion may extend to intersect with the second boundary.

According to the coil device of (9) above, the second connection portion is located inside the folded base film, and thus, breakage is less likely to occur in the second connection portion.

(10) The coil device of (8) above may further include an electronic component disposed between the second portion and the third portion in the state where the base film is folded.

According to the coil device of (10) above, a small-thickness portion exists between the second portion and the third portion, and the electronic component can be disposed in this portion.

Details of Embodiments of the Present Disclosure

Details of embodiments of the present disclosure will be described with reference to the drawings. In the drawings below, the same or corresponding parts are denoted by the same reference characters and redundant description will not be repeated.

First Embodiment

A printed wiring board according to a first embodiment and a coil device according to the first embodiment will be described. In the following description, the printed wiring board according to the first embodiment will be referred to as a printed wiring board 100, and the coil device according to the first embodiment will be referred to as a coil device 200.

<Configuration of Printed Wiring Board 100>

A configuration of printed wiring board 100 will be described below.

Figure 2:
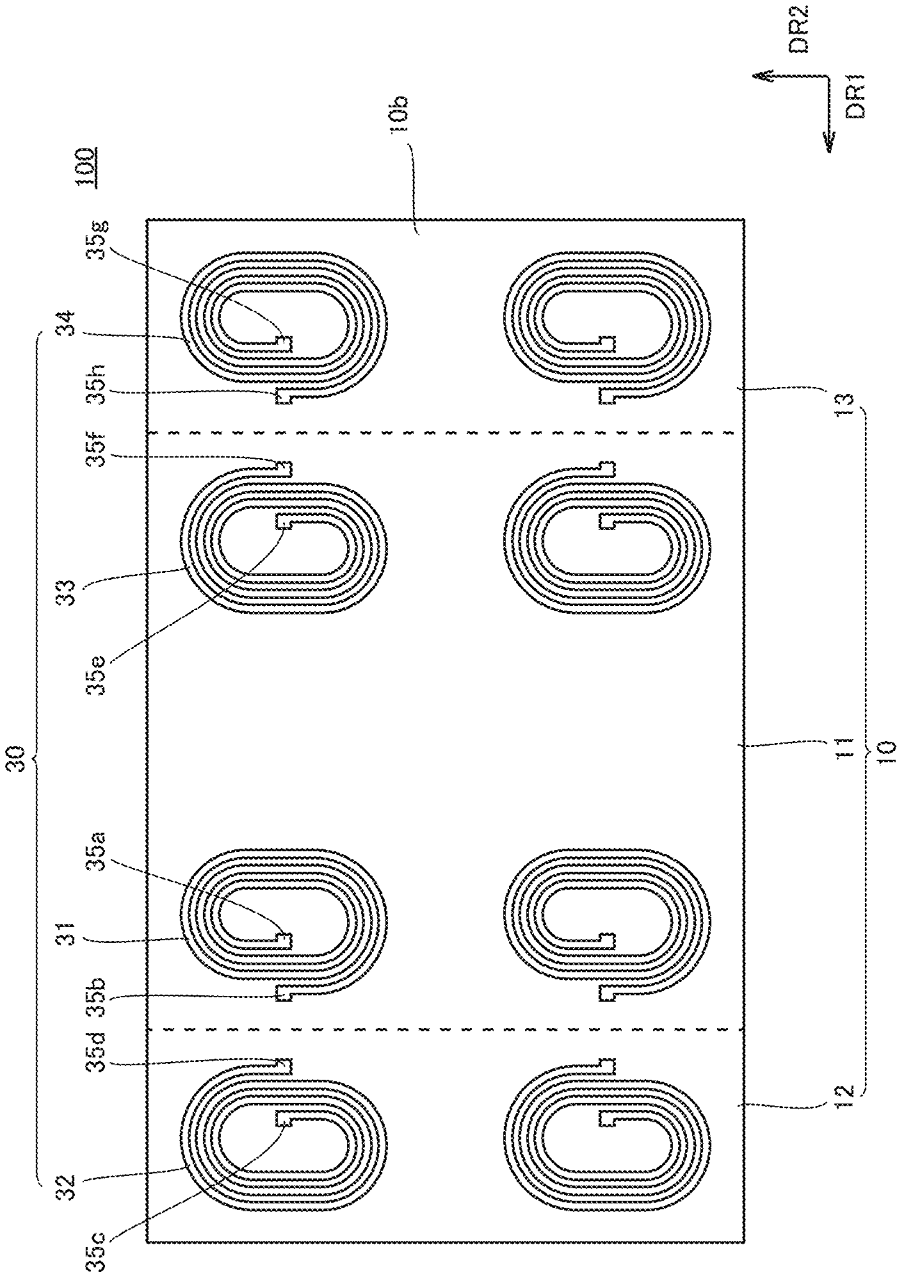
FIG. 2 is a bottom view of printed wiring board 100.
Figure 3A:
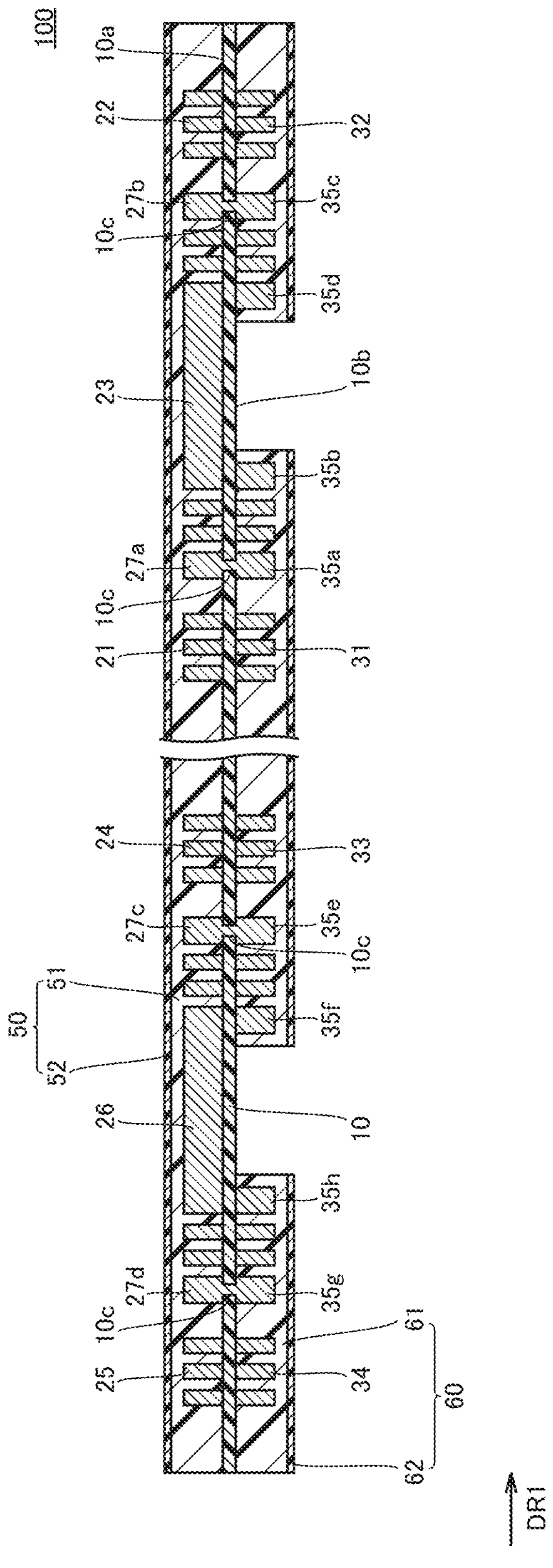
FIG. 3A is a cross-sectional view taken along IIIA-IIIA in FIG. 1.
Figure 3B:
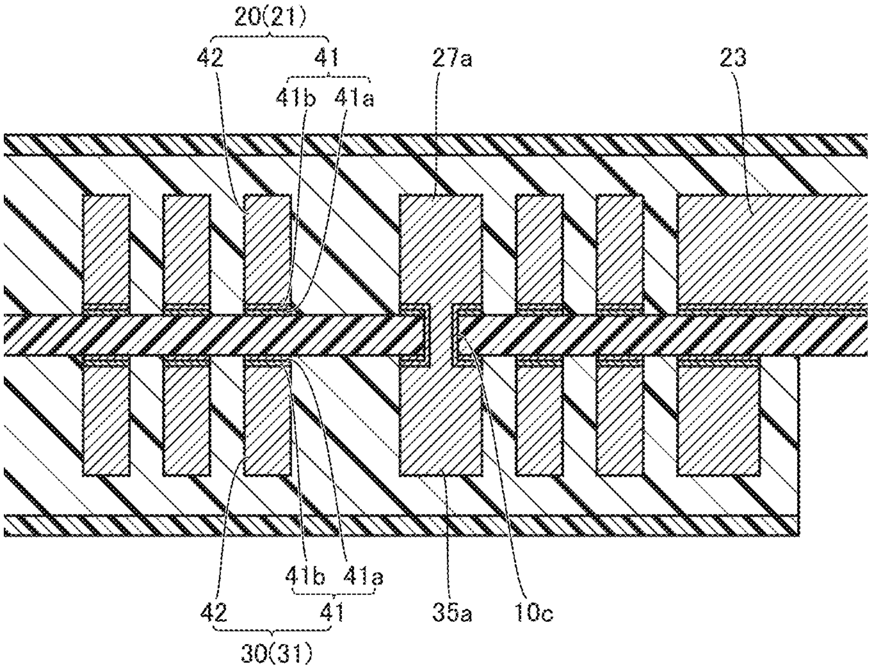
FIG. 3B is a partially enlarged view of FIG. 3A.

FIG. 1 is a plan view of printed wiring board 100. FIG. 2 is a bottom view of printed wiring board 100. FIG. 3A is a cross-sectional view taken along IIIA-IIIA in FIG. 1. FIG. 3B is a partially enlarged view of FIG. 3A. A protective layer 50 is not shown in FIG. 1 and a protective layer 60 is not shown in FIG. 2. As shown in FIGS. 1, 2, 3A, and 3B, printed wiring board 100 has a base film 10, a first wire 20 and a second wire 30.

Base film 10 has a first main surface 10*a* and a second main surface 10*b*. First main surface 10*a* and second main surface 10*b* are end faces of base film 10 in a thickness direction. Second main surface 10*b* is a surface opposite to first main surface 10*a*. Base film 10 is made of an electrically-insulating resin material having flexibility. Base film 10 is made of, for example, polyimide, fluororesin or the like.

A longitudinal direction of base film 10 in a plan view will be referred to as a first direction DR1. A width direction of base film 10 in a plan view will be referred to as a second direction DR2. Second direction DR2 is orthogonal to first direction DR1. Each of first direction DR1 and second direction DR2 is orthogonal to the thickness direction of base film 10. Base film 10 includes first and second sides that are parallel to each other in a plan view, and third and fourth sides that are parallel to each other and orthogonal to the first side (second side) in a plan view. The first side and the second side are longer than the third side and the fourth side. A direction from the third side to the fourth side corresponds to the longitudinal direction (first direction DR1) of base film 10 in a plan view, and a direction from the first side to the second side corresponds to the width direction (second direction DR2) of base film 10 in a plan view.

Base film 10 has a first portion 11 and a second portion 12. Base film 10 may further have a third portion 13. First portion 11, second portion 12 and third portion 13 are arranged along first direction DR1. First portion 11 is sandwiched between second portion 12 and third portion 13 in first direction DR1. A boundary between first portion 11 and second portion 12 (see a dotted line in FIGS. 1 and 2) and a boundary between first portion 11 and third portion 13 (see a dotted line in FIGS. 1 and 2) are along second direction DR2. In other words, each of first portion 11, second portion 12 and third portion 13 has a rectangular shape in a plan view. A width of first portion 11 in first direction DR1 is larger than a width of second portion 12 in first direction DR1 and a width of third portion 13 in first direction DR1.

First wire 20 is disposed on first main surface 10*a*. First wire 20 has a first coil portion 21, a second coil portion 22 and a first connection portion 23. Each of first coil portion 21 and second coil portion 22 is wound spirally in a plan view. First coil portion 21 and second coil portion 22 are located in first portion 11 and second portion 12, respectively. More specifically, first coil portion 21 is disposed in the vicinity of each of four corners of first portion 11 adjacent to second portion 12 in a plan view. In a plan view, second coil portion 22 is opposed to first coil portion 21 with the boundary between first portion 11 and second portion 12 interposed therebetween.

One end and the other end of first coil portion 21 are located on an innermost circumference and an outermost circumference of first coil portion 21, respectively. One end and the other end of second coil portion 22 are located on an innermost circumference and an outermost circumference of second coil portion 22, respectively. First connection portion 23 connects the other end of first coil portion 21 and the other end of second coil portion 22. First connection portion 23 extends to intersect with the boundary between first portion 11 and second portion 12. First connection portion 23 extends along first direction DR1, for example.

Second wire 30 is disposed on second main surface 10*b*. Second wire 30 has a third coil portion 31 and a fourth coil portion 32. Each of third coil portion 31 and fourth coil portion 32 is wound spirally in a plan view. Third coil portion 31 and fourth coil portion 32 are located in first portion 11 and second portion 12, respectively. More specifically, third coil portion 31 is disposed in the vicinity of each of four corners of first portion 11 adjacent to second portion 12 in a plan view. In a plan view, fourth coil portion 32 is opposed to third coil portion 31 with the boundary between first portion 11 and second portion 12 interposed therebetween. Third coil portion 31 is disposed to overlap with first coil portion 21 in a plan view. Fourth coil portion 32 is disposed to overlap with second coil portion 22 in a plan view.

One end and the other end of third coil portion 31 are located on an innermost circumference and an outermost circumference of third coil portion 31, respectively. One end and the other end of fourth coil portion 32 are located on an innermost circumference and an outermost circumference of fourth coil portion 32, respectively.

First wire 20 further has a fifth coil portion 24, a sixth coil portion 25 and a second connection portion 26. Each of fifth coil portion 24 and sixth coil portion 25 is wound spirally in a plan view. Fifth coil portion 24 and sixth coil portion 25 are located in first portion 11 and third portion 13, respectively. More specifically, fifth coil portion 24 is disposed in the vicinity of each of four corners of first portion 11 on the third portion 13 side in a plan view. In a plan view, sixth coil portion 25 is opposed to fifth coil portion 24 with the boundary between first portion 11 and third portion 13 interposed therebetween.

One end and the other end of fifth coil portion 24 are located on an innermost circumference and an outermost circumference of fifth coil portion 24, respectively. One end and the other end of sixth coil portion 25 are located on an innermost circumference and an outermost circumference of sixth coil portion 25, respectively. Second connection portion 26 connects the other end of fifth coil portion 24 and the other end of sixth coil portion 25. Second connection portion 26 extends to intersect with the boundary between first portion 11 and third portion 13. Second connection portion 26 extends along first direction DR1, for example.

Second wire 30 further has a seventh coil portion 33 and an eighth coil portion 34. Each of seventh coil portion 33 and eighth coil portion 34 is wound spirally in a plan view. Seventh coil portion 33 and eighth coil portion 34 are located in first portion 11 and third portion 13, respectively. More specifically, seventh coil portion 33 is disposed in the vicinity of each of four corners of first portion 11 on the third portion 13 side in a plan view. In a plan view, eighth coil portion 34 is opposed to seventh coil portion 33 with the boundary between first portion 11 and third portion 13 interposed therebetween. Seventh coil portion 33 is disposed to overlap with fifth coil portion 24 in a plan view. Eighth coil portion 34 is disposed to overlap with sixth coil portion 25 in a plan view.

One end and the other end of seventh coil portion 33 are located on an innermost circumference and an outermost circumference of seventh coil portion 33, respectively. One end and the other end of eighth coil portion 34 are located on an innermost circumference and an outermost circumference of eighth coil portion 34, respectively.

One end of first coil portion 21 serves as a land 27*a*. The other end of second coil portion 22 serves as a land 27*b*. One end of third coil portion 31 serves as a land 35*a*. Land 35*a* is disposed to overlap with land 27*a* in a plan view. The other end of third coil portion 31 serves as a land 35*b*. One end of fourth coil portion 32 serves as a land 35*c*. Land 35*c* is disposed to overlap with land 27*b* in a plan view. The other end of fourth coil portion 32 serves as a land 35*d*.

One end of fifth coil portion 24 serves as a land 27*c*. The other end of sixth coil portion 25 serves as a land 27*d*. One end of seventh coil portion 33 serves as a land 35*e*. Land 35*e* is disposed to overlap with land 27*c* in a plan view. The other end of seventh coil portion 33 serves as a land 35*f*. One end of eighth coil portion 34 serves as a land 35*g*. Land 35*g* is disposed to overlap with land 27*d* in a plan view. The other end of eighth coil portion 34 serves as a land 35*h*.

First wire 20 and second wire 30 are formed by, for example, a semi-additive process. Each of first wire 20 and second wire 30 has a seed layer 41 and an electrolytic plating layer 42. Seed layer 41 has a first layer 41*a* and a second layer 41*b*. First layer 41*a* is disposed on a main surface (first main surface 10*a*, second main surface 10*b*) of base film 10. Second layer 41*b* is disposed on first layer 41*a*. First layer 41*a* is made of, for example, a nickel-chromium alloy. Second layer 41*b* is made of, for example, copper.

In base film 10, through-holes 10*c* are formed at a position that overlaps with land 27*a* and land 35*a* in a plan view, at a position that overlaps with land 27*b* and land 35*c* in a plan view, at a position that overlaps with land 27*c* and land 35*e* in a plan view, and at a position that overlaps with land 27*d* and land 35*g* in a plan view. Each of through-holes 10*c* passes through base film 10 along the thickness direction. Second layer 41*b* is also disposed on an inner wall surface of each of through-holes 10*c*.

Electrolytic plating layer 42 is disposed on seed layer 41 (second layer 41*b*). Electrolytic plating layer 42 is embedded in each of through-holes 10*c*. By electrolytic plating layer 42 embedded in each of through-holes 10*c*, first coil portion 21 and third coil portion 31 are electrically connected and second coil portion 22 and fourth coil portion 32 are electrically connected. By electrolytic plating layer 42 embedded in each of through-holes 10*c*, fifth coil portion 24 and seventh coil portion 33 are electrically connected and sixth coil portion 25 and eighth coil portion 34 are electrically connected. Electrolytic plating layer 42 is a layer formed by electrolytic plating. Electrolytic plating layer 42 is made of, for example, copper.

Although the case in which first wire 20 and second wire 30 are formed by the semi-additive process has been described above as an example, first wire 20 and second wire 30 may be formed by a subtractive process.

Printed wiring board 100 further has protective layer 50 and protective layer 60. Protective layer 50 has a first layer 51 and a second layer 52. Protective layer 60 has a first layer 61 and a second layer 62.

First layer 51 is disposed on first main surface 10*a* so as to cover first wire 20. First layer 51 is made of, for example, an adhesive. Second layer 52 is disposed on first layer 51. Second layer 52 is made of, for example, polyimide.

First layer 61 is disposed on second main surface 10*b* so as to cover second wire 30. First layer 61 is made of, for example, an adhesive. Second layer 62 is disposed on first layer 61. Second layer 62 is made of, for example, polyimide. Protective layer 60 may be removed at a position that overlaps with the vicinity of the boundary between first portion 11 and second portion 12 in a plan view and at a position that overlaps with the vicinity of the boundary between first portion 11 and the third portion 13 in a plan view.

<Configuration of Coil Device 200>

A configuration of a coil device 200 will be described below.

Figure 4:
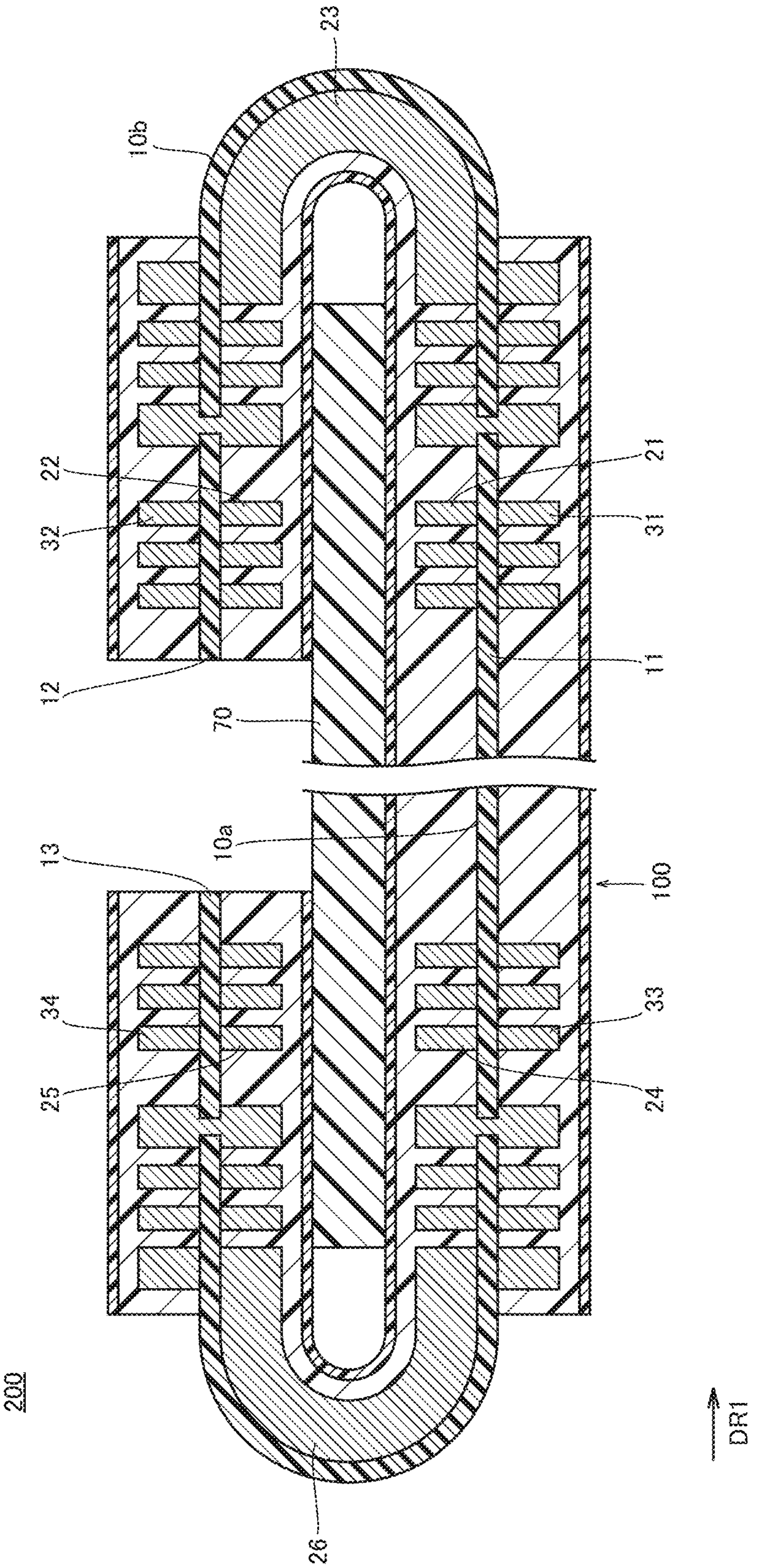
FIG. 4 is a cross-sectional view of a coil device 200.

FIG. 4 is a cross-sectional view of coil device 200. As shown in FIG. 4, coil device 200 has printed wiring board 100 and an adhesive sheet 70.

In coil device 200, base film 10 is folded such that second coil portion 22 overlaps with first coil portion 21 in a plan view. Base film 10 is folded such that a portion of first main surface 10*a* located in second portion 12 faces a portion of first main surface 10*a* located in first portion 11, for example. In addition, in coil device 200, base film 10 is folded such that sixth coil portion 25 overlaps with fifth coil portion 24 in a plan view. Base film 10 is folded such that a portion of first main surface 10*a* located in third portion 13 faces a portion of first main surface 10*a* located in first portion 11, for example.

As described above, first coil portion 21 is disposed to overlap with third coil portion 31 in a plan view, and second coil portion 22 is disposed to overlap with fourth coil portion 32 in a plan view. In addition, as described above, fifth coil portion 24 is disposed to overlap with seventh coil portion 33 in a plan view, and sixth coil portion 25 is disposed to overlap with eighth coil portion 34. Therefore, in a state where base film 10 is folded as described above, first coil portion 21, second coil portion 22, third coil portion 31, and fourth coil portion 32 overlap with each other in a plan view to form one coil, and fifth coil portion 24, sixth coil portion 25, seventh coil portion 33, and eighth coil portion 34 overlap with each other in a plan view to form one coil.

The coil formed by first coil portion 21, second coil portion 22, third coil portion 31, and fourth coil portion 32 generates a magnetic field when an electric current is passed through the coil from land 35*b* and land 35*d*, and the coil formed by fifth coil portion 24, sixth coil portion 25, seventh coil portion 33, and eighth coil portion 34 generates a magnetic field when an electric current is passed through the coil from land 35*f* and land 35*h*.

In the state where base film 10 is folded as described above, second portion 12 partially overlaps with first portion 11 in a plan view, and third portion 13 partially overlaps with first portion 11 in a plan view. In the state where base film 10 is folded as described above, second portion 12 and third portion 13 are spaced apart from each other in first direction DR1. From a different perspective, in coil device 200, a thickness of a portion where first portion 11 does not overlap with any of second portion 12 and third portion 13 is smaller than a thickness of a portion where first portion 11 overlaps with second portion 12 or third portion 13. Although not shown, an electronic component may be disposed in a space between second portion 12 and third portion 13 in the state where base film 10 is folded as described above. This electronic component is, for example, a magnetic sensor.

In the state where base film 10 is folded as described above, adhesive sheet 70 is disposed between a portion of protective layer 50 located on first portion 11 and a portion of protective layer 50 located on second portion 12 and between a portion of protective layer 50 located on first portion 11 and a portion of protective layer 50 located on third portion 13. The folded state of base film 10 as described above is maintained by this adhesive sheet 70. Adhesive sheet 70 is made of, for example, an adhesive.

<Effect of Printed Wiring Board 100 and Coil Device 200>

Coil device 200 has the large-thickness portions (the portion where first portion 11 and second portion 12 overlap with each other and the portion where first portion 11 and third portion 13 overlap with each other) and the small-thickness portion (the portion where first portion 11 does not overlap with any of second portion 12 and third portion 13).

An apparatus (such as an actuator) into which coil device 200 is incorporated has an electronic component, for example. Since coil device 200 can be incorporated into the actuator or the like such that the electronic component or the like is disposed in the small-thickness portion, coil device 200 has improved incorporability.

In coil device 200, base film 10 is folded such that the portion of first main surface 10*a* located in first portion 11 faces the portion of first main surface 10*a* located in second portion 12 and the portion of first main surface 10*a* located in first portion 11 faces the portion of first main surface 10*a* located in third portion 13. Therefore, first connection portion 23 and second connection portion 26 are located inside folded base film 10. Thus, tensile stress is less likely to act on first connection portion 23 and second connection portion 26, and the occurrence of a crack in first connection portion 23 and second connection portion 26 is suppressed. When base film 10 is folded as described above, a curvature radius of first main surface 10*a* becomes smaller than a curvature radius of a neutral axis. The position where the curvature radius becomes smaller than that of the neutral axis as described above is located inside folded base film 10.

Coil device 200 can be assembled by folding base film 10 of printed wiring board 100. Therefore, according to printed wiring board 100, the coil device partially having a small thickness is obtained. In coil device 200, one coil is formed by stacking a plurality of coil portions, and thus, the total number of turns in this one coil increases and the thrust force is increased. From a different perspective, even when the width of the wire in each coil portion is increased to reduce an electrical resistance value, the thrust force can be maintained or increased.

Second Embodiment

A coil device according to a second embodiment will be described. In the following description, the coil device according to the second embodiment will be referred to as a coil device 200A. Here, differences from coil device 200A will be mainly described, and redundant description will not be repeated.

<Configuration of Coil Device 200A>

A configuration of coil device 200A will be described below.

Figure 5:
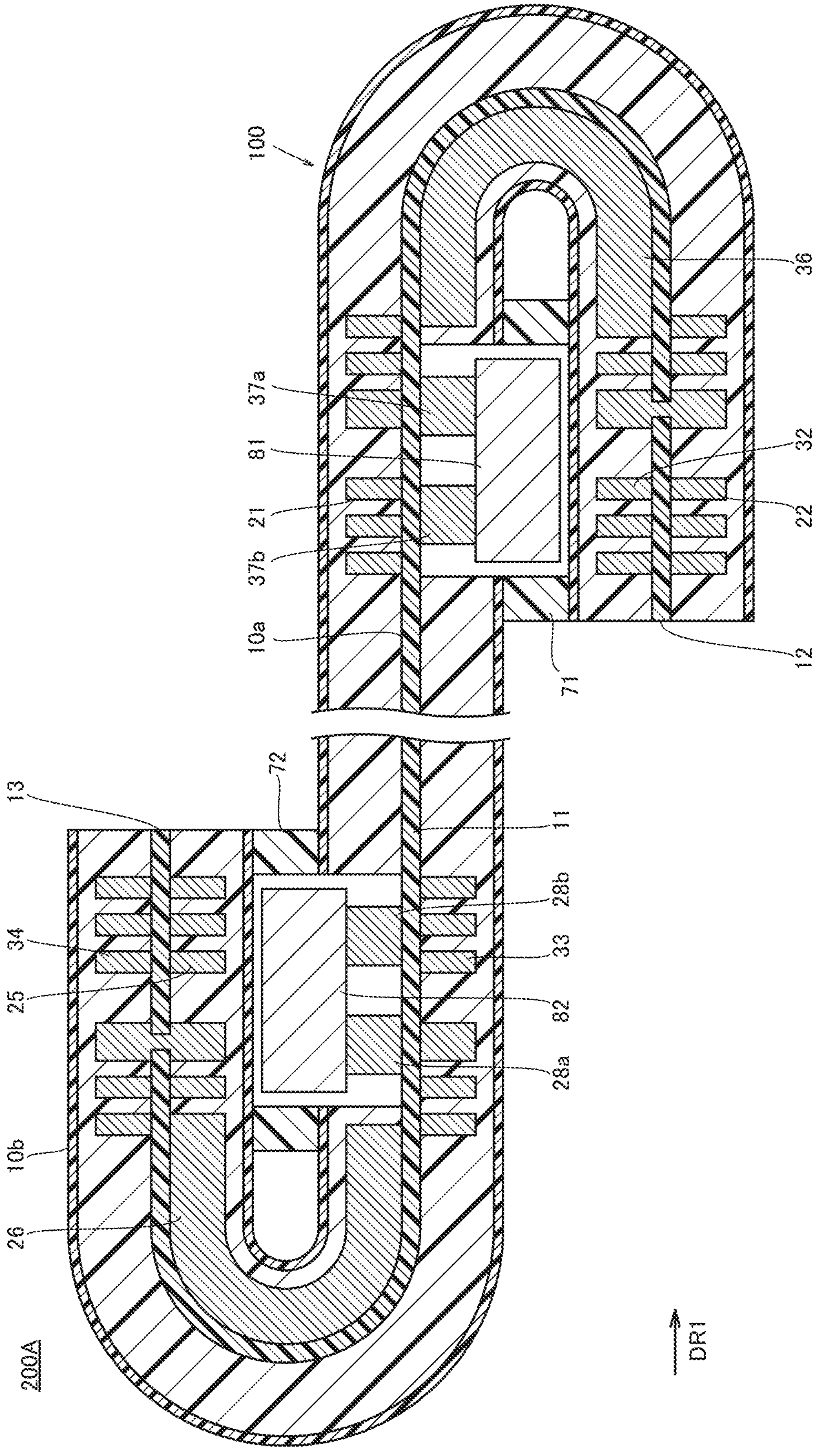
FIG. 5 is a cross-sectional view of a coil device 200A.

FIG. 5 is a cross-sectional view of coil device 200A. As shown in FIG. 5, coil device 200A has printed wiring board 100, and an adhesive sheet 71 and an adhesive sheet 72.

In printed wiring board 100 of coil device 200A, first wire 20 does not have fifth coil portion 24 and first connection portion 23, and second wire 30 does not have third coil portion 31. In addition, in printed wiring board 100 of coil device 200A, second wire 30 has a third connection portion 36. Third connection portion 36 extends along first direction DR1 to intersect with a boundary between first portion 11 and second portion 12 in a plan view.

In coil device 200A, base film 10 is folded such that a portion of second main surface 10*b* located in first portion 11 faces a portion of second main surface 10*b* located in second portion 12 and a portion of first main surface 10*a* located in first portion 11 faces a portion of first main surface 10*a* located in third portion 13. In coil device 200A, the folded state of base film 10 as described above is maintained by adhesive sheet 71 disposed between a portion of protective layer 60 located on first portion 11 and a portion of protective layer 60 located on second portion 12 and adhesive sheet 72 disposed between a portion of protective layer 50 located on first portion 11 and a portion of protective layer 50 located on third portion 13.

Coil device 200A has an electronic component 81 and an electronic component 82. Electronic component 81 and electronic component 82 are disposed between first portion 11 and second portion 12 and between first portion 11 and third portion 13, respectively, in the state where base film 10 is folded as described above. Electronic component 81 is electrically connected to a land 37*a* and a land 37*b* disposed on second main surface 10*b*, and electronic component 82 is electrically connected to a land 28*a* and a land 28*b* disposed on first main surface 10*a*. Land 28*a* and land 28*b* form a part of first wire 20, and land 37*a* and land 37*b* form a part of second wire 30. Protective layer 60 and adhesive sheet 71 are opened to expose land 37*a* and land 37*b*, and protective layer 50 and adhesive sheet 72 are opened to expose land 28*a* and land 28*b*.

<Effect of Coil Device 200A>

The effect of coil device 200A will be described below.

In coil device 200A, electronic component 81 and electronic component 82 can be disposed between first portion 11 and second portion 12 and between first portion 11 and third portion 13, respectively. Therefore, electronic component 81 and electronic component 82 can be mounted in a state of being hidden from the outside.

It should be understood that the embodiments disclosed herein are illustrative and non-restrictive in every respect. The scope of the present invention is defined by the terms of the claims, rather than the embodiments above, and is intended to include any modifications within the scope and meaning equivalent to the terms of the claims.

REFERENCE SIGNS LIST

10 base film; 10*a* first main surface; 10*b* second main surface; 10*c* through-hole; 11 first portion; 12 second portion; 13 third portion; 20 first wire; 21 first coil portion; 22 second coil portion; 23 first connection portion; 24 fifth coil portion; 25 sixth coil portion; 26 second connection portion; 27*a*, 27*b*, 27*c*, 27*d* land; 28*a*, 28*b* land; 30 second wire; 31 third coil portion; 32 fourth coil portion; 33 seventh coil portion; 34 eighth coil portion; 35*a*, 35*b*, 35*c*, 35*d*, 35*e*, 35*f*, 35*g*, 35*h* land; 36 third connection portion; 37*a* land; 37*b* land; 41 seed layer; 41*a* first layer; 41*b* second layer; 42 electrolytic plating layer; 50 protective layer; 51 first layer; 52 second layer; 60 protective layer; 61 first layer; 62 second layer; 70, 71, 72 adhesive sheet; 81, 82 electronic component; 100 printed wiring board; 200, 200A coil device; DR1 first direction; DR2 second direction.

The invention claimed is:

1. A printed wiring board comprising:

a base film having a first main surface and a second main surface;

a first wire disposed on the first main surface;

a second wire disposed on the second main surface;

a first protective layer disposed on the first main surface; and a second protective layer disposed on the second main surface, wherein the base film has a first portion and a second portion, the first portion and the second portion are arranged along a first direction, the first direction being a longitudinal direction of the base film in a plan view, a first boundary is along a second direction orthogonal to the first direction in a plan view, the first boundary being a boundary between the first portion and the second portion, the first protective layer is disposed on the first main surface at the first boundary between the first portion and the second portion and the second protective layer is absent on the second main surface at the first boundary between the first portion and the second portion, the first wire has a first coil portion located in the first portion and wound spirally in a plan view, and a second coil portion located in the second portion and wound spirally in a plan view, and the first portion is disposed to partially overlap with the second portion in a plan view when the base film is folded along the first boundary such that the first coil portion overlaps with the second coil portion in a plan view.

2. The printed wiring board according to claim 1, wherein the second wire has a third coil portion located in the first portion and wound spirally in a plan view, and a fourth coil portion located in the second portion and wound spirally in a plan view, and the third coil portion and the fourth coil portion overlap with the first coil portion and the second coil portion in a plan view, respectively.

3. The printed wiring board according to claim 2, wherein the base film further has a third portion, the first portion is sandwiched between the second portion and the third portion in the first direction, a second boundary is along the second direction in a plan view, the second boundary being a boundary between the first portion and the third portion, the first wire has a fifth coil portion located in the first portion and wound spirally in a plan view, and a sixth coil portion located in the third portion and wound spirally in a plan view, the second wire has a seventh coil portion located in the first portion and wound spirally in a plan view, and an eighth coil portion located in the third portion and wound spirally in a plan view, the seventh coil portion and the eighth coil portion overlap with the fifth coil portion and the sixth coil portion in a plan view, respectively, and the second portion is disposed to be spaced apart from the third portion when the base film is folded along the first boundary such that the first coil portion overlaps with the second coil portion in a plan view and the base film is folded along the second boundary such that the fifth coil portion overlaps with the sixth coil portion in a plan view.

4. A coil device comprising:

a base film having a first main surface and a second main surface;

a first wire disposed on the first main surface;

a second wire disposed on the second main surface, a first protective layer disposed on the first main surface; and a second protective layer disposed on the second main surface, wherein the base film has a first portion and a second portion, the first portion and the second portion are arranged along a first direction before the base film is folded, the first direction being a longitudinal direction of the base film in a plan view, a first boundary is along a second direction orthogonal to the first direction in a plan view, the first boundary being a boundary between the first portion and the second portion, the first protective layer is disposed on the first main surface at the first boundary between the first portion and the second portion and the second protective layer is absent on the second main surface at the first boundary between the first portion and the second portion, the first wire has a first coil portion located in the first portion and wound spirally in a plan view, and a second coil portion located in the second portion and wound spirally in a plan view, the base film is folded along the first boundary such that the first coil portion overlaps with the second coil portion in a plan view, and the first portion partially overlaps with the second portion in a plan view in a state where the base film is folded.

5. The coil device according to claim 4, wherein the second wire has a third coil portion located in the first portion and wound spirally in a plan view, and a fourth coil portion located in the second portion and wound spirally in a plan view, and the third coil portion and the fourth coil portion overlap with the first coil portion and the second coil portion in a plan view, respectively.

6. The coil device according to claim 5, wherein the first main surface located in the first portion partially faces the first main surface located in the second portion, in the state where the base film is folded, the first wire further has a first connection portion that connects the first coil portion and the second coil portion, and the first connection portion extends to intersect with the first boundary.

7. The coil device according to claim 4, wherein the second main surface located in the first portion partially faces the second main surface located in the second portion, in the state where the base film is folded, the second portion is spaced apart from the first portion in the state where the base film is folded, and the coil device further comprises an electronic component disposed between the first portion and the second portion in the state where the base film is folded, and connected to the second wire.

8. The coil device according to claim 5, wherein the base film further has a third portion, the first portion is sandwiched between the second portion and the third portion in the first direction before the base film is folded, a second boundary is along the second direction, the second boundary being a boundary between the first portion and the third portion, the first wire has a fifth coil portion located in the first portion and wound spirally in a plan view, and a sixth coil portion located in the third portion and wound spirally in a plan view, the second wire has a seventh coil portion located in the first portion and wound spirally in a plan view, and an eighth coil portion located in the third portion and wound spirally in a plan view, the seventh coil portion and the eighth coil portion overlap with the fifth coil portion and the sixth coil portion in a plan view, respectively, the base film is folded along the first boundary such that the first coil portion overlaps with the second coil portion in a plan view, and is folded along the second boundary such that the fifth coil portion overlaps with the sixth coil portion in a plan view, and the second portion is spaced apart from the third portion in the state where the base film is folded.

9. The coil device according to claim 8, wherein the first main surface located in the first portion partially faces the first main surface located in the third portion, in the state where the base film is folded, the first wire further has a second connection portion that connects the fifth coil portion and the sixth coil portion, and the second connection portion extends to intersect with the second boundary.

10. The coil device according to claim 8, further comprising an electronic component disposed between the second portion and the third portion in the state where the base film is folded.

* * * * *